United States Patent [19]

Yializis

[11] Patent Number: 4,954,371
[45] Date of Patent: Sep. 4, 1990

[54] FLASH EVAPORATION OF MONOMER FLUIDS

[75] Inventor: Angelo Yializis, Tucson, Ariz.

[73] Assignee: Spectrum Control, Inc., Erie, Pa.

[21] Appl. No.: 70,085

[22] Filed: Jul. 7, 1987

Related U.S. Application Data

[63] Continuation of Ser. No. 877,175, Jun. 23, 1986, abandoned.

[51] Int. Cl.$^5$ .................... B05D 3/06; C23C 16/00
[52] U.S. Cl. ...................... 427/44; 219/273;
  219/275; 427/54.1; 427/80; 427/81; 427/127;
  427/248.1; 427/255.6; 427/421
[58] Field of Search .................. 219/273, 275; 427/44,
  427/54.1, 421, 255.6, 248.1, 80, 81, 127

[56] References Cited

U.S. PATENT DOCUMENTS

| Re. 30,285 | 5/1980 | Babington | 261/78 A |
|---|---|---|---|
| 1,318,774 | 10/1919 | La Bour | 239/224 |
| 1,766,699 | 11/1945 | Von Staden et al. | 202/236 |
| 2,048,888 | 7/1936 | Ott | 261/89 |
| 2,192,140 | 2/1940 | McCreary | 23/259 |
| 2,229,313 | 1/1941 | Snyder | 261/50 |
| 2,258,445 | 10/1941 | Coopey | 299/63 |
| 2,265,762 | 12/1941 | McKittrick et al. | 202/39 |
| 2,313,976 | 3/1943 | Sullivan et al. | 261/15 |
| 2,614,524 | 10/1952 | Haynes | 118/49 |
| 2,695,871 | 11/1954 | Shavel, Jr. et al. | 202/205 |
| 2,734,478 | 2/1956 | Reynolds et al. | 118/9 |
| 2,949,900 | 8/1960 | Bodine | 123/32 |
| 3,081,201 | 3/1963 | Koller | 427/79 |
| 3,130,066 | 4/1964 | Brady | 427/27 |
| 3,192,167 | 6/1965 | Ogawa et al. | 252/359 |
| 3,193,261 | 7/1965 | Nesbitt | 261/142 |
| 3,306,829 | 2/1967 | Patterson et al. | 202/175 |
| 3,328,610 | 6/1967 | Jacke et al. | 310/83 |
| 3,358,931 | 12/1967 | Wirth | 239/223 |
| 3,369,976 | 2/1968 | Temple et al. | 202/236 |
| 3,400,892 | 9/1968 | Ensminger | 239/102 |
| 3,439,477 | 4/1969 | Pyne et al. | 55/237 |
| 3,547,683 | 12/1970 | Williams et al. | 427/35 |
| 3,620,509 | 11/1971 | Roman | 261/18 B |
| 3,902,857 | 9/1975 | Vander Mey et al. | 23/284 |
| 3,904,713 | 9/1975 | Boler | 239/50 |
| 3,978,174 | 8/1976 | Peer | 261/29 |
| 4,076,866 | 2/1978 | Platakis | 427/162 |
| 4,085,893 | 4/1978 | Durley | 239/102 |
| 4,121,537 | 10/1978 | Maruyama et al. | 118/7 |
| 4,153,925 | 5/1979 | Gazard et al. | 361/323 |
| 4,207,836 | 6/1980 | Nonaka | 110/664 |
| 4,261,798 | 4/1981 | Palmer | 203/9 |
| 4,264,539 | 4/1981 | Berg | 261/142 |
| 4,267,976 | 5/1981 | Chatwin | 239/102 |
| 4,277,025 | 7/1981 | Harvey | 239/102 |
| 4,277,516 | 7/1981 | Behn et al. | 427/81 |
| 4,301,765 | 11/1981 | Behn et al. | 118/718 |
| 4,311,275 | 1/1982 | Lindkvist | 239/102 |
| 4,323,524 | 4/1982 | Snowden | 264/8 |
| 4,338,876 | 7/1982 | Norton | 118/259 |
| 4,376,329 | 4/1983 | Behn et al. | 29/25.42 |
| 4,378,382 | 3/1983 | Behn | 427/9 |
| 4,387,113 | 6/1983 | Behn | 427/40 |
| 4,466,571 | 8/1984 | Muhlbauer | 239/101 |
| 4,543,275 | 9/1985 | Akashi et al. | 427/255.6 |
| 4,543,275 | 9/1985 | Akashi et al. | 427/255.6 |

FOREIGN PATENT DOCUMENTS

| 0036617 | 7/1975 | European Pat. Off. |  |
| 84114923 | 7/1984 | European Pat. Off. |  |
| 54-136435 | 10/1979 | Japan . |  |
| 59-177365 | 2/1984 | Japan . |  |
| 9177365 | 10/1985 | Japan | 427/255.6 |
| 1104172 | 2/1968 | United Kingdom . |  |
| 1168641 | 10/1969 | United Kingdom . |  |
| 1253124 | 11/1971 | United Kingdom . |  |

OTHER PUBLICATIONS

Vol. 10 #258 (c–370) (2314) Sep. 4, 1986, JP 61–84367 (A) (ULVAC CORP) (and translation).
Vol. 9 #306 (c–317) (2029), Dec. 3, 1985, JP 60–145372 (A) (Furukawa Denki Kogyo K.K.).

Primary Examiner—Janyce Bell
Attorney, Agent, or Firm—Christie, Parker & Hale

[57] ABSTRACT

A method for continuously supplying a uniform vapor of a polymerizable and/or cross-linkable material. A continuous liquid flow of said material is supplied at a temperature below both the decomposition temperature and the polymerization temperature of said material and atomized into a continuous flow of liquid droplets having a particle size from about 1 to about 50 microns. The droplets are continuously vaporized upon contact with a heated surface which is maintained at a temperature at or above the boiling point for said material, but below the temperature at which said droplets would undergo pyrolysis before vaporizing. The vapor may be deposited onto a substrate and subsequently polymerized or cross-linked.

23 Claims, 3 Drawing Sheets

FLASH EVAPORATION OF MONOMER FLUIDS

This application is a continuation of Ser. No. 877,175, filed June 23, 1986, now abandoned.

FIELD OF THE INVENTION

The present invention relates to a method for depositing a liquid film on a substrate and, more particularly, to a method for depositing a monomeric film on a substrate. Such a film may be polymerized or cross-linked to form a polymeric layer on said substrate.

CROSS-REFERENCES

This invention is related to the following copending, commonly assigned, U.S. patent applications and patents: Ser. No. 620.647, filed June 14, 1984, now abandoned entitled "Minaturized Monolithic Multi-layer Capacitor and Apparatus and Method for Making"; U.S. Pat. No. 4,499,520, issued Feb. 12, 1985, entitled "Capacitor with Dielectric Comprising Poly-Functional Acrylate Polymer and Method of Making"; U.S. Pat. No. 4,490,774, issued Dec. 25, 1984, entitled "Capacitors Containing Polyfunctional Acrylate Polymers as Dielectrics"; U.S. Pat. No. 4,533,710, issued Aug. 6, 1985, entitled "1,2-Alkanediol Diacrylate Monomers and Polymers Thereof Useful as Capacitor Dielectrics"; U.S. Pat. No. 4,513,349 issued Apr. 23, 1985, entitled "Acrylate Containing Mixed Ester Monomers and Polymers Thereof Useful as Capacitor Dielectrics"; U.S. Pat. No. 4,515,931, issued May 7, 1985, entitled "Polyfunctional Acrylate Monomers and Polymers Thereof Useful as Capacitor Dielectrics" U.S. Pat. No. 4,586,111 issued Apr. 29, 1986, entitled "Capacitor with Dielectric Comprising a Polymer of Polyacrylate Polyether Pre-Polymer"; Ser. No. 668,918, filed Nov. 6, 1984, entitled, "Atomizing Device for Evaporation" now abandoned; and Ser. No. 692,746, filed Jan. 18, 1985, entitled "Monomer Atomizer for Evaporator", now abandoned; all of which are hereby incorporated by reference.

BACKGROUND AND OBJECTS OF THE INVENTION

Various industries require the ability to place thin coatings of polymeric materials onto selected substrates. One such industry is the electronics industry, especially the portion thereof which is concerned with the manufacture of polymer monolithic capacitors. Other industries which rely on the production of thin polymeric coatings on various substrates include magnetic tape manufacturers and producers of packaging films.

Capacitors are used in a wide variety of electrical circuits, for example, in relatively high voltage AC power systems (such as the common 110-volt systems) and in relatively low voltage (e.g., under 50 volts) DC systems frequently encountered in printed circuits and the like. Important factors which must be considered in the manufacture of such capacitors are volumetric efficiency, temperature of operation, dissipation factor, especially in AC systems, and behavior upon failure.

The development of electronic devices and circuits of reduced size has led to a need for significantly smaller capacitors having increased volumetric efficiency, or capacitance per unit volume. The polymer monolithic capacitor has been used for such applications.

A monolithic capacitor is one in which the layers of electrodes and dielectric are bonded together in a unitary structure as opposed, for example, to a metallized film capacitor in which self-supporting films are rolled or wound into the capacitor form. A miniaturized capacitor is one of very small dimensions, so as to be suitable for microcircuitry. Small overall size could denote low capacitance of little practical value, except that the thickness of the intervening dielectric layer inversely affects the capacitance between adjacent electrodes, and the number of electrode pairs and dielectric constant of the dielectric directly affects capacitance. Therefore, as a matter of basic capacitor theory, a capacitor having very thin dielectric layers, and many pairs of electrodes or a given capacitor with a dielectric having a high dielectric constant could have substantial capacitance despite being of miniature size with the active area of the electrodes being quite small.

One such type of polymer monolithic multi-layer capacitor is described in application Ser. No. 620,647, now abandoned, cross-referenced herein. That capacitor has a capacitively active section, and two electrode joining sections, each separated from the active section by a sloping section. The capacitor includes a first and second set of electrode layers interleaved with one another, each layer of each set having an active area extending through and contributing to the capacitively active section of the capacitor in a stacked and spaced apart relationship with the active areas of all of the other layers. The electrode layers are joined at the margin in stacked electrically contacting relationship and each layer has a sloped portion between its active area and its margin which contributes to a sloped section of the capacitor. A dielectric coating is in contact with and between each adjacent electrode pair. The dielectric coating has a substantially uniform thickness in the capacitively active section and tapers to zero thickness through the sloping section.

The volumetric efficiency of a capacitor, including the monolithic multi-layer capacitor described above, is normally measured in terms of capacitance per unit volume. Generally, high efficiency is desirable, with values of at least about one-tenth (0.1) microfarad per cubic millimeter for a 50 VDC rated unit being preferred.

As noted above, the volumetric efficiency of the capacitor may be increased by reducing the thickness of the dielectric layer and/or by increasing the number of electrode pairs, both of which may have limits depending upon the capacitor type and its end use.

From the foregoing, it is evident that in order to achieve the results which are desired in accordance with the aforementioned application Ser. No. 620,647, a method for depositing a thin uniform monomeric layer on the desired substrate is absolutely essential. Heretofore, it has been known generally in the art that monomeric layers may be deposited upon substrates. For example, U.S. Pat. No. 3,547,683 and the British counterpart thereof, No. 1,168,641 deal with the vapor deposition of a polymerizable or cross-linkable material which has a vapor pressure under standard temperature and pressure conditions of less than 1 Torr. It appears that the concept embodied in such patents is simply to allow a heated container of the material to vaporize the desired polymerizable or cross-linkable material Such an approach suffers from the fact that by maintaining a polymerizable or cross-linkable material at an elevated temperature for any substantial length of time gives rise to the possibility of degradation and/or polymerization of the material, within the container, both of which are undesirable.

U.S. Pat. Nos. 4,121,537 and 4,207,836 are both concerned with the vapor deposition of a layer of a compound consisting of two or more kinds of elements such as Se, Te or As through flash evaporation, as by dropping raw material, bit-by-bit, into a boat heated to a high temperature with the individual bits being vaporized within a short time. Thus, the approach of using flash evaporation is not taught in said patents to relate to monomeric materials as used in the present invention. A problem with such an approach, as taught in said patents, of course, is that as each drop is vaporized, a burst of vapor is produced, followed by an intermittent period of time during which no vapor is present. Under such conditions, it is difficult to achieve a uniform layer of material on the desired substrate. The foregoing is especially true if the source of the vapor and the substrate are moving in relation to each other.

U.S. Pat. No. 4,153,925 is concerned with the use of electron bombardment or ultraviolet radiation of an organic monomer to make a dielectric layer, generally. However, there is no specific teaching regarding the method by which the monomer is placed on the desired substrate. Likewise, U.S. Pat. Nos. 4,277,516; 4,301,765 and 4,378,382 deal with the glow polymerization of monomers, without any specific indication of how one might achieve a desired uniform monomeric layer. It is believed that the monomers which are glow polymerized and to which those patents relate, are monomers which are typically present under standard temperature and pressure conditions as a gas and thus do not present the same problem as do monomers which are typically used as liquids.

Thus, especially in view of the process disclosed in the aforementioned application, Ser. No. 620,647, now abandoned, there exists a need for a method by which polymerizable and/or cross-linkable materials may be uniformly deposited upon a desired substrate in a controlled manner such that said materials may be subsequently cured to form a desired polymeric layer on said substrate. More generally, a need exists for a method by which materials may be quickly and uniformly deposited upon a desired substrate.

SUMMARY OF THE INVENTION

Generally, the present invention provides a method for depositing onto a substrate a layer of material, which may be a polymerizable and/or cross-linkable material, said material being characterized by the fact that it is chemically unstable at or below its boiling point, said method comprising vaporizing said material by continuously placing droplets of said material into contact with a heated surface which is maintained at a temperature at or above the boiling point for said material, but below the temperature at which said droplets would undergo pyrolysis before vaporizing; maintaining at least a portion of said substrate at a temperature which is below the boiling point of said material and in a region which is at a lower pressure than said vaporized material, to provide a positive flow of vaporized material toward said substrate; and directing the flow of vaporized material onto said substrate in a predetermined manner.

In accordance with the present invention, there is also provided a method for continuously supplying a uniform vapor of a material, which may be a polymerizable and/or cross-linkable material, said method comprising supplying a continuous liquid flow of said material at a temperature below both the decomposition temperature and the polymerization temperature of said material, continuously atomizing the liquid flow into a continuous flow of airborne liquid droplets having a particle size from about 1 to about 50 microns, and continuously vaporizing said liquid droplets by causing said droplets to contact a heated surface which is maintained at a temperature at or above the boiling point for said material, but below the temperature at which said droplets would undergo pyrolysis before vaporizing.

The present invention thus also provides a method for depositing a layer of a material, which may be a polymerizable and/or cross-linkable material, on a substrate comprising supplying a continuous liquid flow of said material at a temperature below both the decomposition and the polymerization temperature, if any, of said material; continuously atomizing said liquid flow into a continuous flow of liquid droplets having a particle size from about 1 to about 50 microns; continuously vaporizing said liquid droplets by causing said droplets to contact a heated surface which is maintained at a temperature at or above the boiling point for said material but below the temperature at which said droplets would undergo pyrolysis before vaporizing; maintaining at least a portion of said substrate at a temperature which is below the boiling point of said material and in a region which is at a lower pressure than said vaporized material, to provide a positive flow of vaporized material toward said substrate; and directing the flow of vaporized material onto said substrate in a predetermined manner.

From the foregoing, it should also be apparent that when the material is polymerizable and/or cross-linkable, by employing the additional step of polymerizing or cross-linking the material on said substrate, a method is also provided for depositing a polymeric coating on at least a portion of the desired substrate.

DETAILED DESCRIPTION OF THE PREFERRED EMBODIMENTS

As discussed, the present invention provides a method for depositing a uniform film of a polymerizable and/or cross-linkable material onto a substrate. The polymerizable and/or cross-linkable material may be referred to hereinafter as a monomer or monomeric material. However, as will be detailed below, the material may itself be polymeric in nature.

Thus, the monomers which are useful in the present invention include all such materials disclosed in the cross-referenced applications discussed above, which are hereby specifically incorporated by reference.

In addition, other monomeric materials which are useful in the practice of the present invention include those discussed in U.S. Pat. No. 3,547,683, including, but not limited to, low molecular weight addition-type polymers, natural oils, silicone, condensation polymers, and other monomers and materials containing unsaturation which are capable of undergoing polymerization or cross-linking.

From the viewpoint of operability in the present process, any monomer employed herein should either be a liquid at room temperature or should be capable of being converted to a liquid at an elevated temperature, without undergoing any significant decomposition or polymerization. Furthermore, the monomeric materials should have a vapor pressure at standard temperature and pressure, of less than about 1 Torr and preferably less than about $10^{-3}$ Torr. It is also contemplated that monomers useful in the present invention include those monomers which, although not themselves a liquid at room temperature are capable of being dissolved in other suitable liquids to form an azeotropic solution.

The particularly preferred monomeric materials for use in the present invention are the polyacrylate polyether prepolymers disclosed in the cross-referenced U.S. Pat. No. 4,586,111, issued Apr. 29, 1986.

The monomers used in the present invention are generally characterized by the fact that they are chemically unstable at temperatures at or even below their boiling point. The term "chemically unstable" is used herein to refer to any type of chemical instability, including, but not limited to, oxidation or other chemical degradation of the monomer as well as the formation of polymers or oligomers.

As indicated above, the first step in the method of the present invention involves continuously supplying droplets of the monomer. Such droplets may be produced by continuously supplying a stream of the liquid monomer and continuously atomizing said monomer into a continuous flow of droplets which preferably are uniform liquid droplets having a particle size from about 1 to about 50 microns. Typically, the particle size of the liquid droplets will be from about 1 to about 20 microns and most typically will be centered around particles having a particle size from about 5 to about 10 microns.

Although, in general, the atomized droplets employed in the present process will fall within the size range of about 1 to about 50 microns, it is theoretically best to use the smallest particle size possible. Thus, particles of less than 1 micron in size may be advantageously employed in the present invention. However, from a practical viewpoint, it is not usually possible to atomize the monomers into such a fine particle size, so other considerations must be used to determine the largest particle size which will be acceptable.

It is, of course, to be appreciated that when discussing the largest particle size employed in any given embodiment of the present invention, the actual droplets employed will have a particle size distribution range peaking at some level significantly below the maximum particle size. Thus, for example, in a typical embodiment of the present invention the particle size employed may range from about 1 to about 20 microns, with the distribution peak occurring at about 10 microns. As used herein, it is to be appreciated that the "particle size" of a particle is meant to refer to the diameter of that particle.

It should be understood that a principal goal of the present invention is to achieve vaporization of the monomer particles from the heated surface in such a manner that no fluid accumulates on said substrate. Thus, to achieve a continuous flow of monomer vapor by vaporizing monomer droplets from the heated surface, the size of those monomer droplets typically needs to be such that the vaporization of the monomer deposited from each droplet will occur in less than about 50 milliseconds, more typically within less than about 20 milliseconds, and most typically within less than about 10 milliseconds. Ideally, it would be preferred for the vaporization of the monomer to occur in less than 1 millisecond. However, practical limitations again usually dictate that the vaporization occur in the range from about 10 to about 20 milliseconds. The actual length of time needed for vaporization is, of course, dependent upon many considerations, besides the size of the monomer droplet. Such considerations include the nature of the monomer, such as its vapor pressure under standard temperature and pressure conditions, the degree of vacuum under which the heated surface is placed, and the temperature to which the surface is heated.

The exact mechanism for atomizing said liquid monomer, in general, is not critical and any suitable method may be employed. However, for many applications it is critical that the method of atomizing said liquid monomer be precise in that substantially all of the particles fall within the desired size range and that the particles are supplied in a continuous flow which is thus not intermittent in nature. The need for the continuous flow is evident when considering the fact that the typical ultimate use may be the deposition of a uniform polymer layer as, for example, a dielectric coating in a monolithic capacitor structure.

One suitable method for atomizing the liquid monomer is disclosed in the cross-referenced application Ser. No. 668,918 and another such method is disclosed in Ser. No. 692,746, filed Jan. 18, 1985, entitled "Monomer Atomizer for Evaporation".

Employing the apparatus taught in either of the two aforementioned applications in the manner described therein will result in the generation of monomer particles of the desired size range, in a continuously flowing, uniform stream. Any other device may be employed to atomize the liquid monomer, so long as it results in the generation of the desired size of particles in a uniform, continuous flow.

With respect to the step of vaporizing the liquid droplets, again, any suitable heated surface may be employed. The temperature of the heated surface should be such that vaporization occurs instantaneously upon contact with the surface by the monomer droplets. However, the temperature should also not be so high as to cause pyrolysis of the material, that is to cause oxidation or other degradation of the monomer structure itself.

With respect to the physical form of the heated surface, any desirable shape may be employed. Various structures are shown in the cross-referenced applications. It is usually desirable for the heated surface to be contained in or to actually form a vaporization chamber in which the liquid droplets may be vaporized. Such a chamber may also define a means for directing the flow of monomer vapor onto a substrate. In such an embodiment, the chamber may terminate in the form of a flow directing means, or nozzle, such that the liquid monomer droplets upon being vaporized create an internal pressure within the chamber causing the monomer vapor to be expelled out the nozzle or other flow directing means in the direction of the substrate.

In the manufacture of monolithic capacitors, the preferred substrate is a copper sheet. As may be appreciated, in the manufacture of monolithic capacitors, the copper sheet may itself be coated with layers of polymeric material, alternating with layers of conducting material, such as aluminum about 200 to 500 angstroms thick. Thus, a typical substrate would be a copper sheet on which alternating layers of polymeric material formed through the method of the present invention and alternating conducting layers of aluminum are present.

The substrate itself should be located in a region which is maintained at a lower pressure than the pressure generated through the vaporization of the monomer droplets. With respect to the pressure employed as in the manufacture of monolithic capacitors, the pressure in the deposition zone is usually below 10 Torr, preferably below $10^{-1}$ Torr and advantageously $10^{-4}$ Torr, or even less.

The layer of film of monomeric material deposited on the substrate may be any suitable depth. However, the depth of the deposited film should usually be such that the subsequent means of polymerization or cross-linking will be effective in curing the monomeric material throughout substantially its entire depth.

With respect to the step of polymerizing the deposited film, any suitable methods may be employed. Thus, thermal, electron beam, or ultraviolet radiation curing may be employed, depending upon the nature of the monomer. A particularly suitable method for curing employs the use of a beam of accelerated electrons whose energy is generally up to about 20 kev, as are available from conventional electron accelerators. The energy of the irradiation and the length of time for which the monomeric film is exposed to the radiation should be such as to polymerize or cross-link the material throughout its thickness. The present invention, in its preferred embodiments, may be further appreciated by reference to the drawings and the following description.

Two different apparatus have been developed for flash vaporizing a liquid according to the present invention. These apparatus will now be described in detail. It is to be understood, however, that these apparatus are not the only apparatus which can be used in practicing the present invention. Any apparatus capable of continuously atomizing a liquid to the appropriate particle size and continuously vaporizing the liquid particles in contact with a heated surface could be used to advantage in the present invention.

Figures 1, 2, 3, 4:
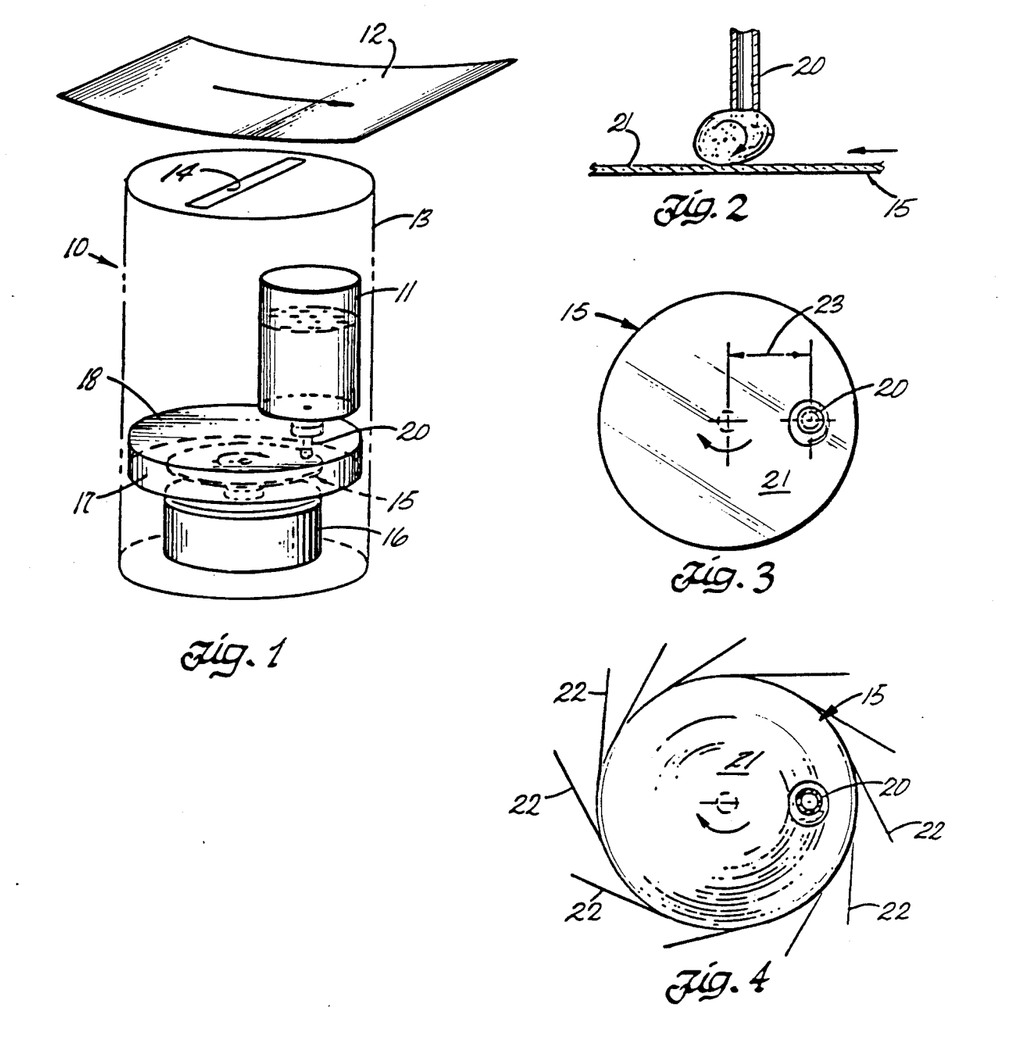
FIG. 1 is a schematic perspective of an apparatus useful in the practice of the method of the present invention.
FIG. 2 is an enlarged fragmentary section of a portion of the apparatus shown in FIG. 2 illustrating the operating phenomenon created.
FIG. 3 is a top view, with a portion sectioned, of the structure shown in FIG. 2.
FIG. 4 is similar to FIG. 3 but illustrates the droplet dispersion resulting from operation of the apparatus.

Turning to FIG. 1, there is shown a first embodiment of an apparatus 10 for vaporizing a liquid, such as a monomeric resin, supplied in a reservoir 11 and depositing by condensing the resulting vapor on a substrate 12 arranged to move past the apparatus 10. It will be understood that both the apparatus 10 and the substrate 11 are maintained in a low vacuum environment. The intent of the vapor deposition is to deposit a uniform, very thin—one micron or less—coating of the liquid material on the substrate 12.

The apparatus includes a vaporization chamber 13 formed with a nozzle opening 14 for emitting the vaporized material in close proximity to the substrate 12. The chamber 13 encloses a spinning disk 15 driven by a motor 15 which throws by centrifugal force atomized droplets of fluid against a band heater 17 defining a heating surface 18 surrounding the disk 15. The tiny droplets are flash upon contact with the heated surface 18, thereby developing both vapor and vapor pressure to expel the gaseous material through the nozzle opening 14 for condensation on the substrate 12. When the fluid is a monomeric liquid, the flash vaporization preserves the chemical structure, and the condensed monomer film on the substrate can be later cured, if desired, by any suitable technique such as applying ultraviolet or electron beam radiation.

In accordance with the invention, the atomizing device includes, in addition to the driven disk 15, a capillary tube 20 mounted on the reservoir 11 for delivering fluid at right angles to the flat circular face 21 of the disk 15, and the end of the tube 20 is spaced from the face 21 so that a liquid drop formed at the tube end is just contacted by the face. With the proper spacing, disk face speed and drop size, the face rotates the drop as shown in FIG. 2 while pulling a fluid film on the face 21 free from the drop, which fluid film is continuously replenished from the tube 20, and the film is thrown centrifugally in atomized droplets having a particle size from about 1 to about 20 microns, from the periphery of the disk onto the heated vaporizing surface 18. The droplets will be thrown from the disk surface 21 along the path lines 22 illustrated in FIG. 4.

If the tube 20 is initially positioned near the center of the spinning disk 15 and then moved peripherally outward so as to gradually increase the speed of the surface contacting the drop, the condition described above and illustrated in FIG. 2 will be reached. Representative relationships found suitable for a monomeric liquid resin included a 20 mil capillary tube feeding liquid to a disk 1" in diameter driven in the 3,000 to 5,000 rpm range. The formed drop, depending upon the liquid's viscosity and surface tension, contacted the disk with the tube end spaced about 37 mils from the disk. The disk was formed of clean glass. The drop rolling and film forming phenomenon was achieved with the spacing 23 (see FIG. 3) of the drop from the disk center being about ⅜". Droplets are produced and discharged along the paths 22.

While the disk surface 21 has been illustrated as horizontal with the tube at a vertical right angle, the surface 21 can be disposed vertically and the tube horizontal so long as the tube is positioned so that the drop contacts the upwardly driven half of the disk surface. So disposed, the viscosity pull of the disk on the liquid counteracts the gravity pull.

The arrangement described produces a continuous rate of very low volume droplets well suited for subsequent flash vaporization and deposition of a very thin coating layer. The vapor delivery rate can be increased, if desired, by pressurizing the reservoir 11. Liquids of varying viscosity would produce initial droplets of varying size depending upon the size of the capillary tube, but the disk and tube relative spacing could obviously be readily varied to accommodate varying drop sizes.

Figure 5:
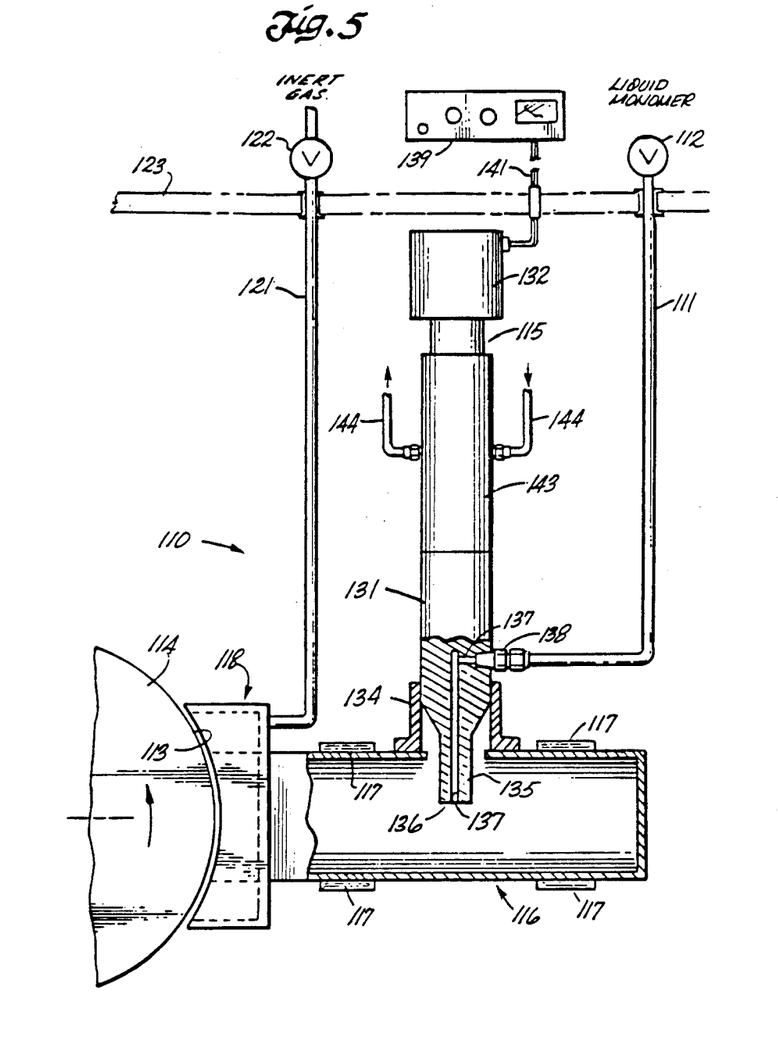
FIG. 5 is a schematic partially sectioned apparatus embodying an atomizer useful in performing the process in accordance with the invention.

FIG. 5 is a schematic partially sectioned apparatus embodying a second, and presently preferred, embodiment of an atomizer useful in performing the process in accordance with the invention.

Turning to FIG. 5, there is shown another apparatus 110 for vaporizing a monomeric liquid supplied through a line 111 and valve 112, and vacuum depositing the vapor onto a surface 113 carried by a rotating drum 114. The liquid is atomized by a structure 115 embodying the invention, vaporized in a vaporization chamber 116 heated by heaters 117, and deposited through nozzle structure 118 onto the drum surface 113. The nozzle structure 118 controls the vapor deposition in part by confining vapor flow with inert gas, supplied through a line 121 and valve 122. The apparatus 110 is mounted within a vacuum chamber 123.

In accordance with this second and preferred embodiment, the structure 115 is essentially integrally formed with a tip portion 131 at one end extending, and delivering liquid, into the vaporization chamber 116 and having an ultrasonic vibration device 132 coupled at the opposite end. The structure 115 is supported by a collar 134 that closes the chamber opening through which the tip portion 131 extends and which is fixed to the tip portion at approximately its nodal point. The tip portion 131 has a necked-down tip 135 ending in a surface 136 to which the liquid is directed through a capillary passage 137 in the tip portion 131 that is connected to the liquid feed line 11 by a compression coupling 138. The device 132, preferably a piezoelectric crystal transducer, is energized by an electronic power supply 139 through a line 141. Ultrasonic vibration of the tip 135 and its surface 136 causes the liquid to flow from the passage 137, coat the surface 136 and be dispersed in fine droplets through a widespread pattern in the chamber 116. The pattern seen is in the form of a shallow cone when a substantially flat surface like the surface 136 is utilized. Upon striking the hot chamber walls, temperatures of 350° to 400° F. being typical, the liquid is vaporized, creating gaseous pressure driving the vapor through the nozzle structure 118 so as to be deposited on the surface 113.

The lengths of the coupling 143 and tip portion 131 correspond to one-half wavelength of the vibration, and the device 132 is operated at their fundamental frequency mode with maximum amplitude of motion at the surface 136 and minimum movement, or node positions, at the attachment points of the coupling 143 and tip portion 131. To protect the vibration device 132 from heat, the structure 115 includes a cooling coupling 143 interposed between and rigidly connected to the tip portion 131 and the vibration device 132. Cooling water is directed through a passage in the coupling 143 using lines 144. The coupling 143 and the cooling water absorb and remove heat conducted from the vaporization chamber 116 along the tip portion 131 so that extreme temperatures cannot adversely affect the vibrating device 132. To minimize vibration absorption, the lines 138, 144 and the connection with the collar 134 are located at or near the vibration node positions. The structure 115 is left supported cantilever fashion by the collar 134 so that the device 132 can vibrate undampened.

It has been found that a material like titanium alloy 6AL4V is suitable for the tip portion 131. The diameter of the passage 137 is dependent upon the flow rate of the liquid being conveyed through the line 111, and diameters of 20 mils to ⅛" have been found suitable.

The basic structure represented by the tip portion 131, vibration device 132 and electronics 139 can be found in standard laboratory equipment such as ultrasonic emulsifying devices and this utilization of relatively standard components makes the atomizer structure economical to manufacture and maintain.

Capacitors made using the method of the present invention may be formed of materials and in configurations known in the art. The conductive materials are typically aluminum, zinc, alloys of these metals and bi-layers involving at least aluminum or zinc and another metal, with aluminum being preferred. Aluminum and zinc are unique because of their contribution to the self healing properties of a capacitor. For example, one embodiment of the present invention provides a capacitor which includes a first electrode which may be, for example, an aluminum layer, a dielectric coating of a polymer formed by deposition of a monomeric material in solution, on the surface of the first electrode by the method of the present invention, followed by polymerization and a second electrode which is a second thin metallized layer preferably of aluminum deposited on the dielectric film Suitable leads are attached to the first and second electrodes.

The present invention likewise is useful in the manufacture of polymer monolithic multi-layer capacitors such as those described and claimed in application Ser. No. 620,647. Capacitors of this type may be produced by depositing alternating electrode and dielectric layers so as to provide alternate electrode layers with portions projecting from the stack and contacting each other in electrically connected relation as more fully described in that application. The dielectric coating comprises a polymer which is formed by using the method of the present invention to deposit a layer of a monomeric material on the electrode and subsequent polymerization of the monomeric material. The use of electron beam polymerization is particularly preferred because it provides rapid polymerization of the pre-polymer without the need for additional curing agents, and thus leads to economical production of very thin coatings.

Figure 6:
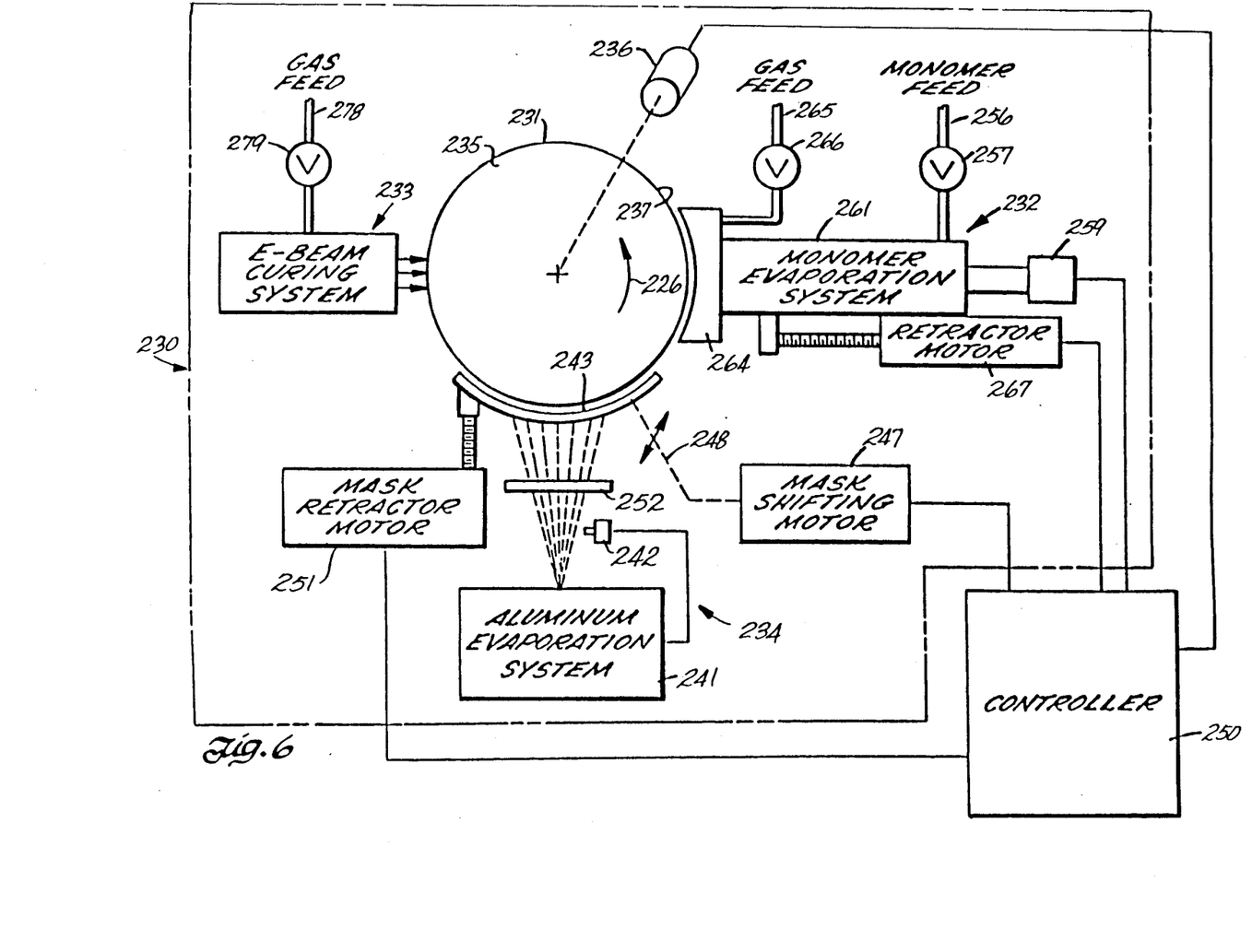
FIG. 6 is a schematic of an apparatus used to manufacture polymer monolithic capacitors, employing the method of the present invention.

The method of the present invention wherein the layer of monomeric material is deposited on a substrate and subsequently polymerized or cross-linked may thus be employed in the manufacture of polymer monolithic capacitors using an apparatus arranged as shown in FIG. 6 which includes apparatus arranged within and around a chamber 230 which is either a vacuum chamber or a housing divided into vacuum portions. Within a vacuum environment is a carrier 231, a dielectric deposit system 232, a monomer curing system 233, and an electrode material deposit system 234. A substantial vacuum is required down to the order of $1 \times 10^{-4}$ Torr.

The carrier 231 is a water cooled drum 235 driven by a motor 236 and whose outer cylindrical surface 237 defines a rapidly moving continuous surface passing through a dielectric forming zone and an electrode forming zone. The regions in which the drum surface 237 and the systems 232, 233 are located constitute the dielectric forming zone, and the region in which the drum surface 237 and the system 234 are located constitute an electrode forming zone. Drum rotation creates the machine direction 226, which is the direction the surface passes through the dielectric forming zone and the electrode forming zone.

Because of the small dimensions involved, the surface 237 should be smooth and true. The sheet of substrate 213 is firmly secured to the drum 35 and, when in place, the outer surface of the substrate defines the surface 237. The drum 235 is cooled to about 70° F. so as to facilitate condensation of the vapor deposits, and the apparatus functions at drum surface speeds of 150 to 600 feet per minute.

The electrode material deposit system 234 includes a conventional electron beam vaporization device 241 such as those used for metallizing film within a vacuum environment. The rate of vaporization is sensed by a conventional quartz monitoring device 242 providing feedback for controlling the rate at which aluminum is vaporized by the device 241.

The alternate pattern of metal vapor deposition is obtained by shifting the mask 243 axially of the drum 235 upon each drum revolution. A mask motor 247 makes the shifting movement through a simple mechanical connection 248. A controller 250 is connected to the drum motor 236 for sensing drum revolution, and the controller 250 supplies the appropriate shifting signal to the mask shifting motor 247. It is desirable to keep the mask 243 close to the surface onto which the metal vapor is being deposited, and this closeness is maintained by a mask retraction motor 251 which steps the mask away from the surface 237 upon each drum revolution, as signalled by the controller 250, through a distance approximating the thickness of the electrode layer being deposited.

As it is convenient to energize the device 241 and bring it into stable operating condition before beginning to make capacitors, a removable shutter 252 is interposed between the device 241 and the mast 243 for closing off the passage of vapor until the shutter 252 is withdrawn.

As a feature of the invention, the dielectric deposit system 232 flash vaporizes the dielectric in monomer form as discussed above in conjunction with FIGS. 1 through 5.

The condensed liquid monomer is radiation cured by the second system 233 in the dielectric forming zone which includes a radiation source, preferably a gas discharge electron beam gun.

The overall operation of the apparatus of FIG. 6 can now be readily understood. Electrode layers are deposited, coated with dielectric and the dielectric cured, before the surface on which the electrode layers are deposited passes again for successive electrode layers and dielectric coatings. Desired thicknesses of the electrode layers and dielectric coatings are determined by matching the rate of vapor deposition with the surface speed of the drum 235.

The above description has paid particular attention to application of the method of the present invention in making polymer monolithic multi-layer capacitors. However, the method of the present invention should not be understood as being limited to such an application or even limited to depositing a monomeric film on a substrate for subsequent polymerization and/or cross-linking. The method of the present invention can be used to advantage in any application requiring a controlled supply of vaporized material. For example, if the material to be evaporated is a mixture of components having different vapor pressure, flash vaporization provides a supply of vapor wherein the components are present in the same ratios as in the mixture. This would not be true of a supply of vapor created by bulk evaporation of the mixture. Thus, flash vaporization is particularly beneficial in any application requiring a controlled supply of a vaporized mixture, such as chemical vapor deposition.

What is claimed is:

1. A method for continuously supplying a uniform vapor of a polymerizable material, said method comprising:

supplying a continuous liquid flow of said material at a temperature below both the decomposition temperature and the polymerization temperature of said material;

continuously atomizing the liquid flow into a continuous flow of liquid droplets; and continuously vaporizing said liquid droplets by causing said droplets to contact a heated surface which is maintained at a temperature at or above the boiling point for said material, but below the temperature at which said droplets would undergo pyrolysis before vaporizing.

2. A method for depositing onto a substrate a layer of polymerizable material, said material being characterized by the fact that it is chemically unstable at or below its boiling point, said method comprising:

vaporizing said material by continuously placing droplets of said material into contact with a heated surface which is maintained at a temperature at or above the boiling point for said material, but below the temperature at which said droplets would undergo pyrolysis before vaporizing;

maintaining at least a portion of said substrate at a temperature which is below the boiling point of said material and in a region which is at a lower pressure than said vaporized material, to provide a positive flow of vaporized material toward said substrate; and directing the flow of vaporized material onto said substrate.

3. The method of claim 2 wherein the substrate is maintained in a region which is at a pressure below about $10^{-1}$ Torr 4. The method of claim 2 wherein the material is polymerizable and cross-linkable and also comprising the step of polymerizing and cross-linking the material on said substrate.

5. The method of claim 4 wherein the material is polymerized and cross-linked throughout its thickness by use of electron beam curing.

6. A method for depositing a layer of a polymerizable material on a substrate comprising:

supplying a continuous liquid flow of said material at a temperature below both the decomposition and the polymerization temperature of said material;

continuously atomizing said liquid flow into a continuous flow of liquid droplets;

continuously vaporizing said liquid droplets by causing said droplets to contact a heated surface which is maintained at a temperature at or above the boiling point for said material but below the temperature at which said droplets would undergo pyrolysis before vaporizing;

maintaining at least a portion of said substrate at a temperature which is below the boiling point of said material and in a region which is at a lower pressure than said vaporized material, to provide a positive flow of vaporized material toward said substrate; and directing the flow of vaporized material onto said substrate.

7. The method of claim 6 wherein the substrate is maintained in a region which is at a pressure below about $10^{-1}$ Torr.

8. The method of claim 6 wherein the material is polymerizable and cross-linkable and also comprising the step of polymerizing or cross-linking the material on said substrate.

9. The method of claim 8 wherein the material is polymerized and/or cross-linked throughout its thickness by use of electron beam curing.

10. A method for continuously supplying a uniform vapor of a polymerizable material, said method comprising:

providing a liquid supply of said material, at a temperature below both the decomposition temperature and the polymerization temperature of said material, to a drop just contacting a flat face of a disk;

rotating the disk so that a fluid film is pulled on the face free from the drop and a continuous flow of liquid droplets is thrown from the periphery of the disk; and continuously vaporizing said liquid droplets by causing said droplets to contact a heated surface which is maintained at a temperature at or above the boiling point for said material, but below the temperature at which said droplets would undergo pyrolysis before vaporizing.

11. A method according to claim 10 also comprising the steps of:

maintaining at least a portion of a substrate at a temperature which is below the boiling point of said material and in a region which is at a lower pressure than said vaporized material, to provide a positive flow of vaporized material toward said substrate; and directing the flow vaporized material onto said substrate.

12. A method according to claim 11 wherein the substrate is maintained in a region which is at a pressure below about $10^{-1}$ Torr.

13. A method according to claim 11 wherein the material is polymerizable and cross-linkable and also comprising the step of polymerizing and cross-linking the material on said substrate.

14. A method according to claim 13 wherein the material is polymerized and cross-linked throughout its thickness by use of radiation.

15. A method according to claim 14 wherein the source of radiation is an electron beam gun.

16. A method for continuously supplying a uniform vapor of a polymerizable material, said method comprising:

providing a liquid supply of said material, at a temperature below both the decomposition temperature and the polymerization temperature of said material, to an end surface at a tip of an ultrasonic vibration device;

ultrasonically vibrating said device so that the material supplied to the end surface coats the end surface and is dispersed in droplets from the periphery of the end surface; and continuously vaporizing said liquid droplets by causing said droplets to contact a heated surface which is maintained at a temperature at or above the boiling point for said material, but below the temperature at which said droplets would undergo pyrolysis before vaporizing.

17. A method according to claim 16 wherein the ultrasonic vibration device is fixedly mounted at a nodal point.

18. A method according to claim 17 wherein the end surface is positioned with respect to the mounting of the device so as to be at the maximum amplitude of motion for the device while it is vibrating.

19. A method according to claim 16 also comprising the steps of:

maintaining at least a portion of a substrate at a temperature which is below the boiling point of said material and in a region which is at a lower pressure then said vaporized material, to provide a positive flow of vaporized material toward said substrate; and directing the flow of vaporized material onto said substrate.

20. A method according to claim 19 wherein the substrate is maintained in a region which is at a pressure below about $10^{-1}$ Torr.

21. A method according to claim 19 wherein the material is polymerizable and cross-linkable and also comprising the step of polymerizing and cross-linking the material on said substrate.

22. A method according to claim 21 wherein the material is polymerized and cross-linked throughout its thickness by use of radiation.

23. A method according to claim 22 wherein the source of radiation is an electron beam gun.

* * * * *

UNITED STATES PATENT AND TRADEMARK OFFICE
CERTIFICATE OF CORRECTION

PATENT NO. : 4,954,371

DATED : September 4, 1990

INVENTOR(S) : Angelo Yializis; Mooyoung Ham; Gregg C. Bischoff

It is certified that error appears in the above-identified patent and that said Letters Patent is hereby corrected as shown below:

ON TITLE PAGE:

[75] Inventor: After "Angelo Yializis, Tucson, Ariz." add -- Mooyoung Ham, Scotia, N.Y., and Gregg C. Bischoff, Seminole, Fl. --

Column 1, line 16, change "620.647" to -- 620,647 --.
Column 1, line 28, Change "Acrylate Containing" to -- Acrylate-Containing --.

Column 2, line 64, after "material" insert a period.

Column 7, line 42, after "thickness" insert a period.

Column 8, line 5, after "flash" insert -- vaporized --.

Column 9, line 21, change "Which" to -- which --.
Column 9, line 23, change "line 11" to -- line 111 --.

Column 10, line 17, after "film" insert a period, and move "Suitable" two spaces to the right.

UNITED STATES PATENT AND TRADEMARK OFFICE
CERTIFICATE OF CORRECTION

PATENT NO. : 4,954,371
DATED : September 4, 1990
INVENTOR(S) : Angelo Yializis; Mooyoung Ham; Gregg C. Bischoff It is certified that error appears in the above-identified patent and that said Letters Patent is hereby corrected as shown below:

Column 12, line 23, after "Torr" insert a period.

Column 12, line 67, before "cross-linking" change "or" to -- and --.

Column 13, line 2, before "cross-linked" change "and/or" to -- and --.

Column 14, line 31, change "then" to -- than --.

Signed and Sealed this

Twenty-first Day of July, 1992

Attest:

DOUGLAS B. COMER

*Attesting Officer*    *Acting Commissioner of Patents and Trademarks*